(12) United States Patent
Kim et al.

(10) Patent No.: US 10,971,379 B2
(45) Date of Patent: Apr. 6, 2021

(54) WAFER BONDING APPARATUS AND WAFER BONDING SYSTEM USING THE SAME

(71) Applicant: SAMSUNG ELECTRONICS CO., LTD., Suwon-si (KR)

(72) Inventors: Jun-hyung Kim, Yongin-si (KR); Sung-hyup Kim, Hwaseong-si (KR); Tae-yeong Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 16/276,904

(22) Filed: Feb. 15, 2019

(65) Prior Publication Data
US 2020/0013643 A1 Jan. 9, 2020

(30) Foreign Application Priority Data
Jul. 6, 2018 (KR) .................. 10-2018-0078931

(51) Int. Cl.
*H01L 21/67* (2006.01)
*H01L 21/687* (2006.01)
(Continued)

(52) U.S. Cl.
CPC ...... *H01L 21/67092* (2013.01); *H01L 21/187* (2013.01); *H01L 21/2007* (2013.01); *H01L 21/687* (2013.01); *B29C 65/002* (2013.01); *B29C 65/7841* (2013.01); *B29C 66/345* (2013.01); *B29C 66/452* (2013.01);
(Continued)

(58) Field of Classification Search
CPC ....... B29C 65/00; B29C 65/002; B29C 65/02; B29C 65/48; B29C 65/78; B29C 65/7841; B29C 65/7847; B29C 65/7852; B29C 65/7802; B29C 65/782; B29C 66/00; B29C 66/01; B29C 66/345; B29C 66/41; B29C 66/45; B29C 66/452; B29C 66/80; B29C 66/81; B29C 66/814; B29C 66/8141; B29C 66/81422; B29C 66/81425; B29C 66/81455; B29C 66/8322; B29C 66/90; B29C 66/92; H01L 21/67092;
(Continued)

(56) References Cited

U.S. PATENT DOCUMENTS

| | | |
|---|---|---|
| 6,706,618 B2 | 3/2004 | Takisawa et al. |
| 7,479,441 B2 | 1/2009 | Kirk et al. |

(Continued)

FOREIGN PATENT DOCUMENTS

| | | | |
|---|---|---|---|
| JP | 2009010072 A | * | 1/2009 |
| KR | 10-2004-0021969 A | | 3/2004 |
| KR | 10-1833101 B1 | | 2/2018 |

*Primary Examiner* — Philip C Tucker
*Assistant Examiner* — Brian R Slawski
(74) *Attorney, Agent, or Firm* — Lee IP Law, P.C.

(57) ABSTRACT

A wafer bonding apparatus includes a first bonding chuck to fix a first wafer on a first surface thereof, a second bonding chuck to fix a second wafer on a second surface thereof facing the first surface, a bonding initiation member at a center of the first bonding chuck to push the first wafer towards the second surface, and a membrane member including a protrusion protruding from a center portion of the second surface towards the first surface, and a planar portion defining the protrusion on an outer region surrounding the center portion.

20 Claims, 13 Drawing Sheets

(51) Int. Cl.
*H01L 21/18* (2006.01)
*H01L 21/20* (2006.01)
*B29C 65/00* (2006.01)
*B29C 65/78* (2006.01)
*B32B 37/10* (2006.01)

(52) U.S. Cl.
CPC .. *B29C 66/81422* (2013.01); *B29C 66/81425* (2013.01); *B29C 66/81455* (2013.01); *B29C 66/92* (2013.01); *B32B 37/10* (2013.01); *B32B 2457/14* (2013.01)

(58) Field of Classification Search
CPC ............... H01L 21/6838; H01L 21/185; H01L 2224/94; B32B 37/10; B32B 2457/14
USPC ..... 156/60, 64, 87, 160, 163, 196, 212, 349, 156/350, 367, 378, 381, 382, 443, 475, 156/476, 493, 538, 539, 556, 580, 581; 438/14, 16, 455, 457; 257/E21.088
See application file for complete search history.

(56) References Cited

U.S. PATENT DOCUMENTS

| | | | |
|---|---|---|---|
| 7,988,803 | B2 | 8/2011 | Takasaki et al. |
| 8,206,525 | B2 | 6/2012 | Izumi |
| 8,475,612 | B2 | 7/2013 | Gaudin |
| 9,490,158 | B2 | 11/2016 | Huang et al. |
| 9,539,800 | B2 | 1/2017 | Kito et al. |
| 9,586,391 | B2 | 3/2017 | Hayashi et al. |
| 2007/0034322 | A1* | 2/2007 | Glacet ................ B29D 11/0073 156/230 |
| 2015/0056783 | A1 | 2/2015 | Kerdiles et al. |
| 2015/0357226 | A1* | 12/2015 | Liu ................... H01L 21/67092 438/457 |
| 2016/0225655 | A1 | 8/2016 | Matsui et al. |
| 2018/0047699 | A1* | 2/2018 | Omori ..................... H01L 21/64 |

\* cited by examiner

FIG. 13A
FIG. 13B
FIG. 13C
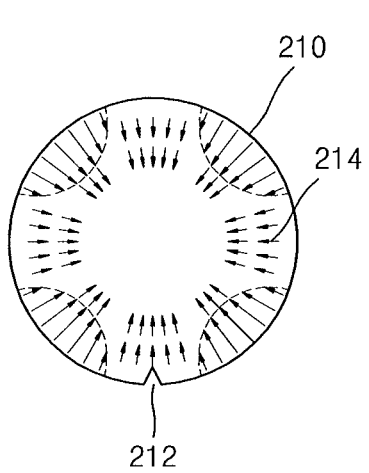
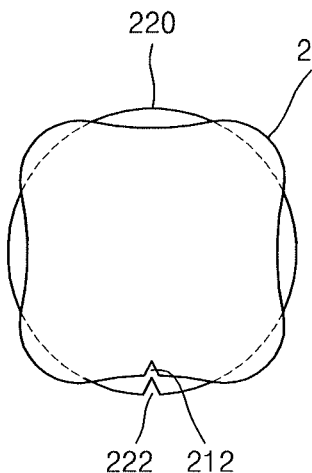
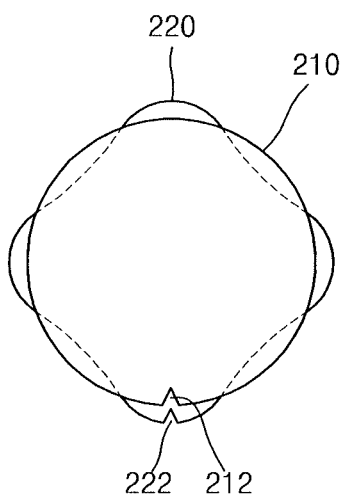
FIG. 14
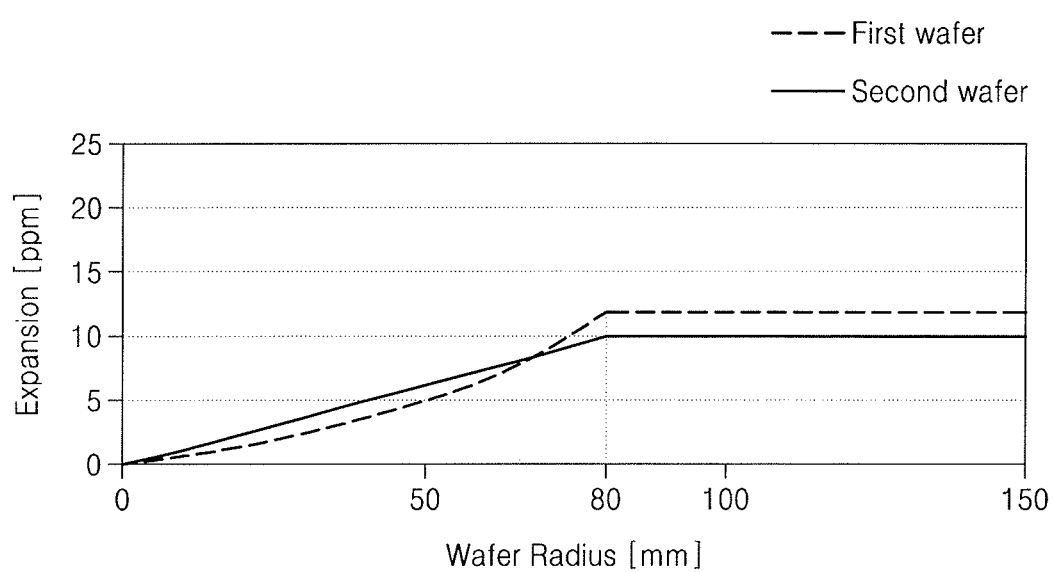

WAFER BONDING APPARATUS AND WAFER BONDING SYSTEM USING THE SAME

CROSS-REFERENCE TO RELATED APPLICATION

Korean Patent Application No. 10-2018-0078931, filed on Jul. 6, 2018, in the Korean Intellectual Property Office, and entitled: "Wafer Bonding Apparatus and Wafer Bonding System Using the Same," is incorporated by reference herein in its entirety.

BACKGROUND

1. Field

Embodiments relate to a wafer bonding apparatus and a wafer bonding system using the wafer bonding apparatus, and more particularly, to a wafer bonding apparatus capable of improving bonding accuracy in a wafer-to-wafer bonding process and a wafer bonding system using the wafer bonding apparatus.

2. Description of the Related Art

In a process of manufacturing a semiconductor device, a wafer bonding process, i.e., bonding of two wafers, may be performed. Such a wafer bonding process may be used to improve density of semiconductor chips in a semiconductor device. For example, a semiconductor module having a structure in which semiconductor chips are stacked allows a wiring length between semiconductor chips to be reduced so that signals may be processed at high speed while also increasing density of the semiconductor chips. When a semiconductor module having stacked semiconductor chip structure is manufactured, dicing a wafer in units of stacked semiconductor chips after performing a bonding process in units of wafers may have higher productivity than a bonding operation that bonds individual semiconductor chips. A wafer bonding process may be performed in a wafer-to-wafer bonding method, i.e., two wafers are directly bonded to each other without intervening an additional medium. The wafer-to-wafer bonding method may be generally performed by using a wafer bonding apparatus that includes a bonding chuck on which wafers are arranged and fixed, and an element for bringing the wafers into contact.

SUMMARY

According to an aspect, there is provided a wafer bonding apparatus including: a first bonding chuck to fix a first wafer on a first surface thereof; a second bonding chuck to fix a second wafer on a second surface thereof facing the first surface; a bonding initiation member at a center of the first bonding chuck to push the first wafer in towards the second surface; and a membrane member including a protrusion protruding from a center portion of the second surface towards the first surface, and a planar portion defining the protrusion on an outer region surrounding the center portion of the second surface.

According to an aspect, there is provided a wafer bonding apparatus including: a first bonding chuck to fix a first wafer on a first surface thereof; a second bonding chuck to fix a second wafer on a second surface thereof facing the first surface; a bonding initiation member at a center of the first bonding chuck to push the first wafer towards the second surface; an aperture stop serving as the second surface of the second bonding chuck; and a membrane member including a protrusion protruding from an opening portion of the aperture stop in a direction towards the first surface and a planar portion in a closed portion of the aperture stop.

According to an aspect, there is provided a wafer bonding system including: a first bonding chuck to fix a first wafer arranged on a first surface thereof; a second bonding chuck to fix a second wafer on a second surface thereof facing the first surface; a bonding initiation member at on a center of the first bonding chuck to push the first wafer towards the second surface; a membrane member including a protrusion protruding from a center portion of the second surface towards the first surface, and a planar portion defining the protrusion on an outer region surrounding the center portion of the second surface; a sensor spaced apart from the first bonding chuck and the second bonding chuck to measure a bonding propagation distance of the first wafer; and a controller to control a shape of the membrane member according to the bonding propagation distance.

BRIEF DESCRIPTION OF THE DRAWINGS

Features will become apparent to those of skill in the art by describing in detail exemplary embodiments with reference to the attached drawings in which:

FIGS. 13A to 13C illustrate plan views showing relative deformations on a first wafer and a second wafer in a wafer bonding apparatus without deformation compensation;

FIG. 14 illustrates a graph showing relative deformations in a first wafer and a second wafer in a wafer bonding apparatus according to an embodiment.

DETAILED DESCRIPTION

Hereinafter, one or more embodiments will be described in detail with reference to accompanying drawings.

Figure 1:
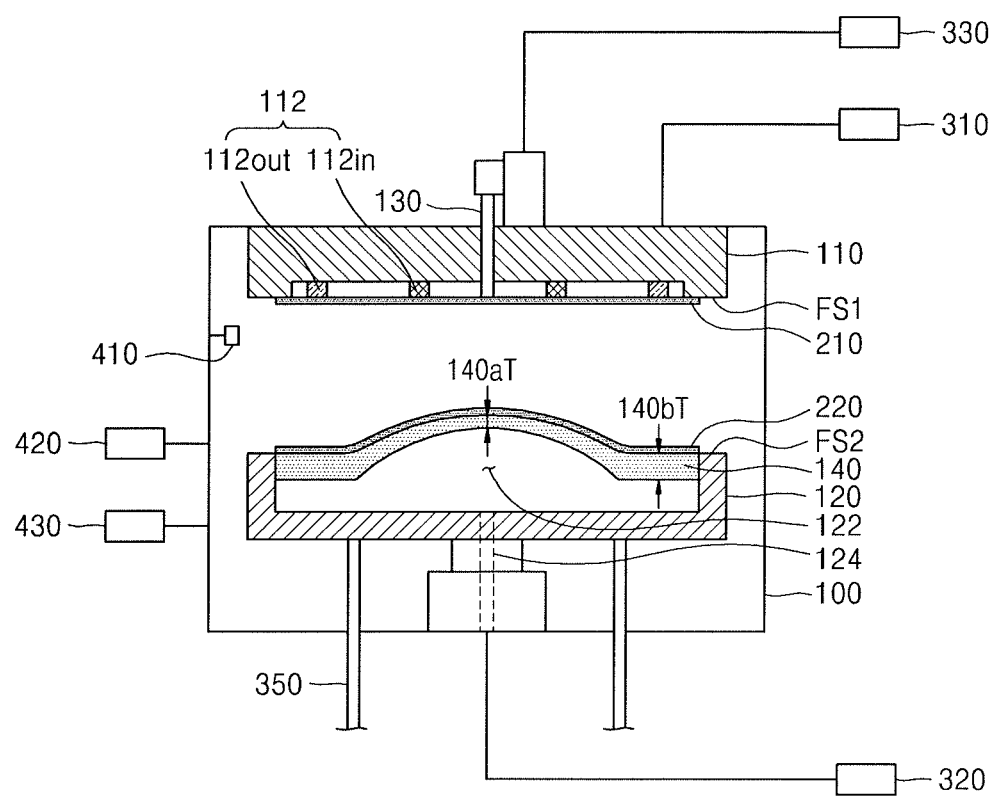
FIGS. 1 to 4 illustrate diagrams of a wafer bonding apparatus according to an embodiment.
Figure 2:
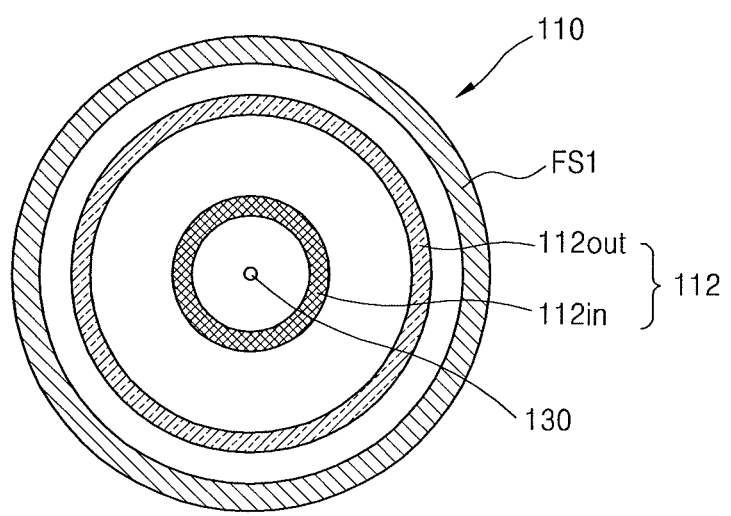
Figure 3A:
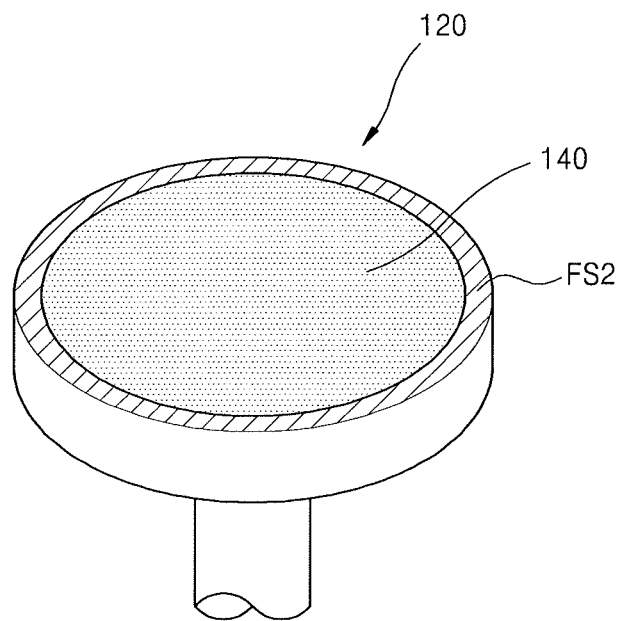
Figure 3B:
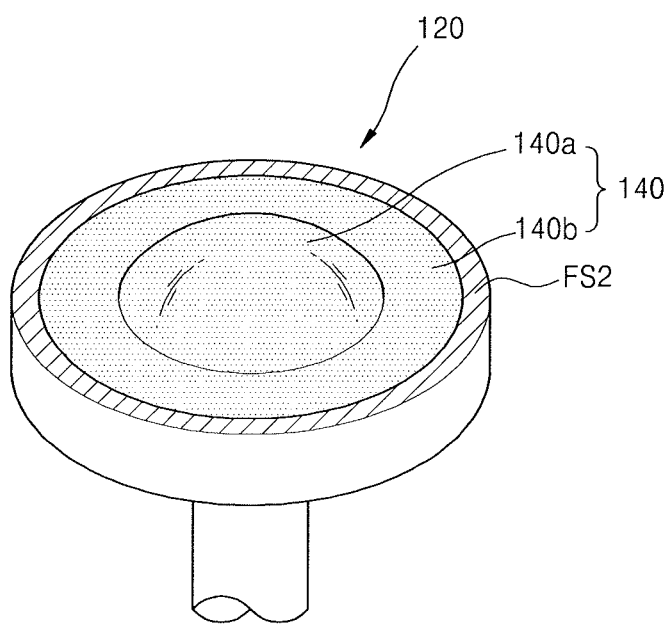
Figure 4:
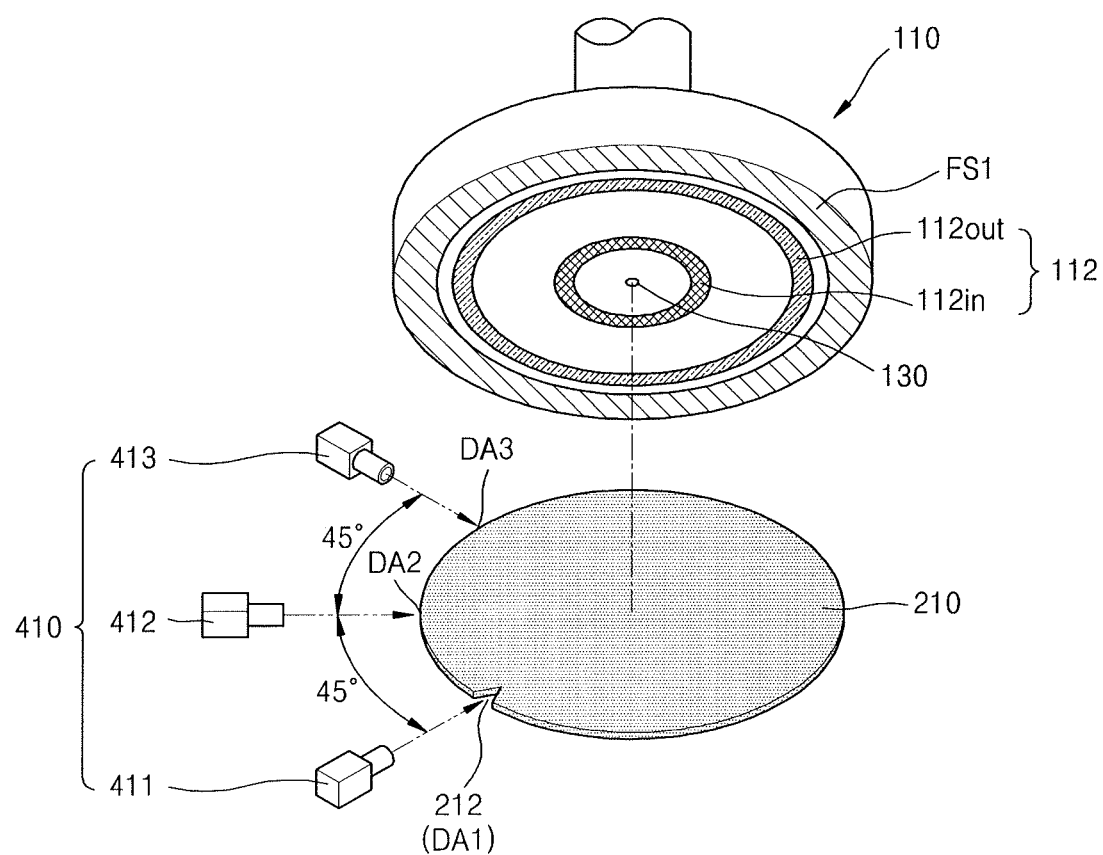

FIGS. 1 to 4 are diagrams of a wafer bonding apparatus 10 according to an embodiment. Referring to FIGS. 1 to 4, the wafer bonding apparatus 10 according to the embodiments may include a chamber 100, a first bonding chuck 110, a second bonding chuck 120, a bonding initiation member 130, a membrane member 140, and a sensor unit 410. In particular, FIG. 1 is a sectional view of the wafer bonding apparatus 10; FIG. 2 is a plan view of the first bonding chuck 110; FIGS. 3A and 3B are perspective views of the second bonding chuck 120; and FIG. 4 is a perspective view of the sensor unit 410.

The chamber 100 may be a housing that surrounds the first bonding chuck 110 and the second bonding chuck 120. For example, the chamber 100 may be made of aluminum and may have an internal space of the chamber 100 at vacuum pressure or atmosphere pressure. The chamber 100 may protect a first wafer 210 on the first bonding chuck 110 and a second wafer 220 on the second bonding chuck 120 against the external environment.

The first wafer 210 serving as a bonding target is arranged and fixed on the first bonding chuck 110, which may be referred to as an upper chuck. For example, the first bonding chuck 110 may made of a combination of aluminum and ceramic. A surface of the first bonding chuck 110, i.e., a first surface FS1, faces downward, i.e., faces the second bonding chuck 120, and a vacuum recess 112 may be formed in the first surface FS1. The vacuum recess 112 may have a circular loop shape and may include an internal vacuum recess 112in formed in a center region of the first surface FS1 and an external vacuum recess 112out formed in an outer region of the first surface FS1. Alternatively, the vacuum recess 112 may be freely formed without any kind of rules or may have an oval shape or a polygonal shape. Further alternatively, only one vacuum recess 112 or three or more vacuum recesses 112 may be used.

The vacuum recess 112 may be connected to a vacuum pump 310 via an internal pipe in the first bonding chuck 110 and an external pipe on an outer portion of the first bonding chuck 110. In some embodiments, the internal vacuum recess 112in and the external vacuum recess 112out may be connected to each other via the internal pipe and may be connected together to the vacuum pump 310. Alternatively, the internal vacuum recess 112in and the external vacuum recess 112out may not be connected to each other and may be separately connected to the vacuum pump 310. When the vacuum pump 310 operates and the vacuum recess 112 performs a vacuum suction operation, the first wafer 210 may be adsorbed and fixed onto the first surface FS1 of the first bonding chuck 110.

The second bonding chuck 120 is a structure to which the second wafer 220 that is a bonding target is arranged and fixed, and may be referred to as a lower chuck. For example, the second bonding chuck 120 may be made of a combination of aluminum and ceramic, like the first bonding chuck 110. The second bonding chuck 120 may be spaced a predetermined distance from the first bonding chuck 110 to face the first bonding chuck 110. An upper surface of the second bonding chuck 120, i.e., a second surface FS2, may face the first surface FS1, and the second wafer 220 may be arranged and fixed onto the second surface FS2 of the second bonding chuck 120.

The second wafer 220 may be fixed to the second bonding chuck 120 in various ways. In some embodiments, the second bonding chuck 120 may include a vacuum recess that is similar to that of the first bonding chuck 110, and the second bonding chuck 120 may fix the second wafer 220 via the vacuum suction using the vacuum recess. In some other embodiments, the second bonding chuck 120 may fix the second wafer 220 by using an electrostatic force, e.g., an electrostatic chuck. In some other embodiments, the second bonding chuck 120 may fix the second wafer 220 by using a physical fixing device, e.g., a lift pin, a holder, etc. In addition, the first bonding chuck 110 may also be an electrostatic chuck.

The bonding initiation member 130 may be penetrate a center of the first bonding chuck 110. The bonding initiation member 130 is shown as an elongated cylindrical rod shape, but this is a simplified shape taking into account functional aspects of the bonding initiation member 130 and alternative shapes may be used.

The bonding initiation member 130 may press a center of the first wafer 210 fixed on the first surface FS1 of the first bonding chuck 110 to move the first wafer 210 downward towards the second surface FS2 of the second bonding chuck 120. Accordingly, bonding the first wafer 210 and the second wafer 220 starts from center portions thereof, and then, the bonding may propagate to outer regions thereof. As the bonding propagates, the first wafer 210 may be sequentially isolated, e.g., separated, from the first surface FS1 of the first bonding chuck 110, and isolation of the first wafer 210 may propagate from the center portion to the outer region of the first wafer 210 at a similar time to propagation of the bonding.

In some embodiments, before bonding the first wafer 210 to the second wafer 220, the vacuum suction of the first wafer 210 by the internal vacuum recess 112in has to be stopped first. When the vacuum suction is maintained, propagation of the bonding and/or isolation of the first wafer 210 may be stopped around the internal vacuum recess 112in. In some other embodiments, when a bonding force between the first wafer 210 and the second wafer 220 is greater than an adsorption force due to the vacuum suction, even when the vacuum suction of the first wafer 210 is maintained, propagation of the bonding may not be stopped, but may proceed continuously.

The membrane member 140 may be adjacent the second surface FS2 in order to deform the second wafer 220 on the second bonding chuck 120. A process of deforming a shape of the membrane member 140 will be briefly described below.

First, the membrane member 140 may start in a state of preparing for adsorbing the second wafer 220 from the second bonding chuck 120, e.g., a flat shape as shown in FIG. 3A. The second wafer 220 may be arranged and fixed onto the membrane member 140 that is flat in the second bonding chuck 120. In some embodiments, the vacuum pump 310 may be connected to the second bonding chuck 120 similarly to the first bonding chuck 110 and may be used to fix the second wafer 220 with a vacuum pressure.

Next, pneumatic pressure provided from an air pump 320 may be applied to a void portion 122, i.e., an empty space between a lower surface of the membrane member 140 that faces an upper surface (a surface contacting wafer) and the second bonding chuck 120. Accordingly, as shown in FIG. 3B, the membrane member 140 has a protrusion 140a at a center portion thereof and a planar portion 140b at an outer region thereof. The second wafer 220 may be conformally arranged along the shape of the membrane member 140.

In other words, the membrane member 140 may include the protrusion 140a protruding from the center portion thereof in a direction of the first surface FS1, and the planar portion 140b defining the protrusion 140a at the outer region surrounding the center portion thereof. The membrane member 140 may have a thickness that varies between the center portion and the outer region thereof. Therefore, differential pressure may be applied to the center portion and the outer region of the membrane member 140.

A thickness 140aT of the protrusion 140a in the membrane member 140 may be less than a thickness 140bT of the planar portion 140b. In some embodiments, the thickness 140aT of the protrusion 140a is the smallest at the center thereof and is gradually increased towards a periphery. In addition, the thickness 140bT of the planar portion 140b may be substantially constant regardless of the location. For example, the membrane member 140 may include a flexible material.

Due to the pneumatic pressure provided from the air pump 320, the protrusion 140a of the membrane member 140 may be formed as a hemispherical surface having a predetermined radius in a protruding direction. Also, the predetermined radius of the hemispherical surface may vary according to a variation in the pneumatic pressure provided from the air pump 320.

An air tube 124 connected to the air pump 320 may be in communication with the void portion 122 of the second bonding chuck 120. A pressure in the void portion 122 may be controlled by a controller 430. The shape of the membrane member 140 may be deformed according to the pressure of the void portion 122. When the pressure of the void portion 122 is high, the radius of the hemispherical surface may increase. When the pressure of the void portion 122 is low, the radius of the hemispherical surface may decrease. Also, the membrane member 140 may have another shape.

Thus, the shape of the protrusion 140a may be deformed due to the pneumatic pressure provided from the air pump 320. As described above, since the shape of the membrane member 140 may be changed, the shape of the second wafer 220 that is conformally arranged along the shape of the membrane member 140 may be also changed. Therefore, the wafer bonding apparatus 10 according to the embodiment may provide a profile capable of improving a bonding accuracy between the first wafer 210 and the second wafer 220.

During a wafer-to-wafer bonding process, the shape of the first wafer 210 may be largely deformed at a center portion thereof as compared to the deformation on the outer region. Accordingly, as described above, the shape of the second wafer 220 may be adjusted to be deformed to compensate for the deformation of the first wafer 210. Thus, bonding accuracy of the wafers may be improved and errors in finishing the wafer bonding may be reduced.

The first and second wafers 210 and 220 may each include an active surface on which a semiconductor device is arranged and a non-active surface facing the active surface. The active surface may correspond to a frontside surface in each of the first and second wafers 210 and 220, and the non-active surface may correspond to a backside surface in each of the first and second wafers 210 and 220.

In some embodiments, the non-active surface of the first wafer 210 may contact the first surface FS1 of the first bonding chuck 110 and the non-active surface of the second wafer 220 may contact the second surface FS2 of the second bonding chuck 120. Alternatively, the active surface of the first wafer 210 may be contact the first surface FS1 of the first bonding chuck 110 and the active surface of the second wafer 220 may contact the second surface FS2 of the second bonding chuck 120.

The first and second wafers 210 and 220 may include, e.g., silicon. Alternatively, the first and second wafers 210 and 220 may include a semiconductor element, e.g., germanium, or a compound semiconductor such as silicon carbide (SiC), gallium arsenide (GaAs), indium arsenide (InAs), or indium phosphide (InP).

In the present specification, it is assumed that the first and second wafers 210 and 220 may each have a diameter of about 12 inches (300 mm) and include silicon. Alternatively, the first and second wafers 210 and 220 may have a diameter that is less or greater than the above example and that the first and second wafers 210 and 220 may include other materials than the silicon.

In some embodiments, the first and second wafers 210 and 220 may each include a semiconductor device layer having a plurality of individual devices and a wiring structure layer for electrically connecting the plurality of individual devices to one another. The plurality of individual devices may each be a volatile memory and/or a non-volatile memory. The volatile memory may be, e.g., dynamic random access memory (DRAM), static RAM (SRAM), etc., and the non-volatile memory may be, for example, a flash memory, magnetic RAM (MRAM), phase change RAM (PRAM), etc. The wiring structure layer may include a metal wiring layer and/or a via plug. The wiring structure layer may have a multi-layered structure, e.g., a structure in which two or more metal wiring layers and/or two or more via plugs are alternately stacked. In some other embodiments, the first and second wafers 210 and 220 may each include a logic chip, a system-on-chip (SOC), an application specific integrated circuit (ASIC), an image sensor chip, etc.

For example, the first wafer 210 may include a logic chip, and the second wafer 220 may include a memory chip. Alternatively, the first wafer 210 may include a logic chip, and the second wafer 220 may include an image sensor chip.

The vacuum pump 310 may be connected to the vacuum recess 112 via an external pipe and an internal pipe in the first bonding chuck 110. The vacuum pump 310 may create a vacuum in the vacuum recess 112 such that the vacuum recess 112 vacuum adsorbs the first wafer 210. The vacuum pump 310 may be connected to the controller 430 to provide the vacuum recess 112 in the vacuum state according to control of the controller 430. The vacuum supply from the vacuum pump 310 may correspond to the vacuum suction by the vacuum recess 112, and termination of the vacuum supply from the vacuum pump 310 may correspond to termination of the vacuum suction of the vacuum recess 112.

The air pump 320 may be connected to the void portion 122 via the second bonding chuck 120 and the air tube 124. The air pump 320 supplies the void portion 122 with pneumatic pressure to deform the shape of the membrane member 140. The air pump 320 may be connected to the controller 430 to provide the void portion 122 with the pneumatic pressure according to the control of the controller 430.

An initiation translation member 330 may move the bonding initiation member 130 upward and downward. The initiation translation member 330 may be connected to the controller 430 to move the bonding initiation member 130 upward and downward under control of the controller 430. The initiation translation member 330 may include various types of actuators capable of moving the bonding initiation member 130 upward and downward, e.g., towards and away from the second bonding chuck. In addition, a chuck translation member 350 similar to the initiation translation member 330 may be connected to the first bonding chuck 110 and/or the second bonding chuck 120 and may move the first bonding chuck 110 and/or the second bonding chuck 120 upward and downward towards each other under control of the controller 430. As shown herein, the chuck translation member 350 is only connected to the second bonding chuck 120.

A sensor unit 410 may be spaced apart from the first bonding chuck 110 and the second bonding chuck 120 and may be arranged at a side of the chamber 100. Here, the sensor unit 410 may be a three-dimensional (3D) sensor that three-dimensionally senses a physical variation in whole part of the first wafer 210.

The sensor unit 410 may include, e.g., at least one of an infrared sensor, an ultrasound sensor, and a laser sensor. The infrared sensor, the ultrasound sensor, and the laser sensor may be classified according to what types of waves they transmit and detect to determine physical variations visible light, e.g., infrared light, ultrasound waves, or visible light. The ultrasound sensor exhibits excellent durability, stabilized operation without a deviation, and fast and sensitive reactions. Principles of the above sensor are well known in the art, and thus, detailed descriptions thereof are omitted.

The sensor unit 410 of the wafer bonding apparatus 10 according to an embodiment may sense a state in which the first wafer 210 protrudes from the first surface FS1 when the first wafer 210 is entirely attached to the first bonding chuck 110. For example, the sensor unit 410 may measure protrusion of the first wafer 210 from the first surface FS1 of the first bonding chuck 110 from various angles to obtain an exact result.

Detection of a wafer bonding state in the wafer bonding apparatus 10 according to the embodiment will be described below. First, the first wafer 210 and the second wafer 220 may be respectively arranged and fixed onto the first bonding chuck 110 and the second bonding chuck 120. Next, the center of the first wafer 210 is pressed downward by the bonding initiation member 130. Then, bonding to a center portion of the second wafer 220 may start. Next, propagation of the bonding proceeds to outer regions of the first wafer 210 and the second wafer 220, and such propagation may be sensed by the sensor unit 410. Since the sensor unit 410 measures propagation of the bonding and this measurement is compared with predetermined rules, the accuracy in the wafer bonding state may be determined as discussed below.

During wafer bonding, progress of bonding between the first wafer 210 and the second wafer 220 is sensed three-dimensionally by a plurality of sensor units 410. Thus, the bonding state between the first wafer 210 and the second wafer 220 may be exactly measured. Also, when accuracy of the wafer bonding state degrades, a location where a wafer deformation occurs may be exactly detected by the plurality of sensor units 410.

As shown in FIG. 4, at least three measurement regions DA1, DA2, and DA3 may be set on the first wafer 210 on the first surface FS1 of the first bonding chuck 110. Also, three sensor units, e.g., first, second, and third sensors units 411, 412, and 413 may be located corresponding to the three measurement regions DA1, DA2, and DA3.

For example, the first sensor unit 411 corresponds to the first measurement region DA1 including an alignment feature 212, e.g., a notch, for aligning the first wafer 210, the second sensor unit 412 may correspond to the second measurement region DA2 rotated by about 45° from the first measurement region DA1 in a clockwise direction, and the third sensor unit 413 may correspond to the third measurement region DA3 rotated by about 45° from the second measurement region DA2 in the clockwise direction, on an outer side of the first wafer 210. The three measurement regions DA1, DA2, and DA3 may be arranged along an outer circumference of the first wafer 210. Alternatively, the three sensor units, i.e., the first, second, and third sensor units 411, 412, and 413, may be arranged at locations for measuring the three measurement regions DA1, DA2, and DA3; e.g., may be arranged along a virtual circle having a diameter that is greater than that of the first wafer 210. Further alternatively, four or more measurement regions and corresponding four or more sensor units 410 may be provided.

As described above, the three measurement regions DA1, DA2, and DA3 are spaced apart from one another by about a 45° angle because, as described above, the first wafer 210 includes silicon and the silicon is a material having a crystallographic orientation, and the first wafer 210 may also have a crystallographic orientation. In more detail, a direction of the alignment feature 212 for aligning the first wafer 210 may correspond to a crystallographic orientation [110]. A crystallographic orientation [100] or [010] may be arranged at a 45° angle from the crystallographic orientation [110]. According to the crystallographic orientation, a degree of the deformation in the first wafer 210 may vary. Thus, the three measurement regions DA1, DA2, and DA3 may be spaced apart from one another by about a 45° angle in order to exactly measure the deformation.

The three sensor units, i.e., the first, second, and third sensor units 411, 412, and 413, corresponding to the three measurement regions DA1, DA2, and DA3, may measure whether propagation of the bonding between the first wafer 210 and the second wafer 220 or propagation of the isolation of the first wafer 210 from the first surface FS1 of the first bonding chuck 110 is performed accurately in view of time and/or location.

According to the wafer bonding apparatus 10 of the embodiment, the wafer bonding state and the deformed location of the wafer may be accurately detected by the plurality of sensor units 410. Thus, the operation of the wafer bonding apparatus 10 may be performed accurately in the wafer bonding process and accuracy in the wafer bonding process may be improved.

A data processor 420 analyzes data measured by the sensor unit 410 to determine whether the bonding between the first wafer 210 and the second wafer 220 is propagating accurately. In detail, when the sensor unit 410 transmits data after measuring a pressure variation, an electrical variation, and/or a distance variation from the three measurement regions DA1, DA2, and DA3 at a set time point, the data processor 420 may determine whether propagation of the bonding between the first wafer 210 and the second wafer 220 based on the measurement data.

The data processor 420 may appropriately set the measurement regions according to time and location. Also, the data processor 420 may detect a deformed location of the wafer by analyzing the measurement data from the sensor unit 410. For example, the data processor 420 records and analyzes bonding propagation states according to time and location and matches recorded results to a location of the first wafer 210 and/or the second wafer 220, and/or the wafer deformation to accurately detect the deformed location of the wafer in the wafer bonding process. In addition, the data processor 420 is connected to the controller 430, and the controller 430 may directly control the wafer bonding apparatus 10 according to the result of the data processor 420.

The controller 430 may be electrically connected to each component in the wafer bonding apparatus 10 and may control overall operations of each component. For example, the controller 430 may be implemented as a kind of a circuit, an electronic component, a micro-processor, or a program capable of applying a movement control signal to the bonding initiation member 130 and the initiation translation member 330, applying a vacuum control signal to the vacuum pump 310, and a pneumatic pressure control signal to the air pump 320. Also, the controller 430 may be electrically connected to the sensor unit 410 to control operations of the sensor unit 410 and may directly control the wafer bonding apparatus 10 according to the result of the data processor 420.

Figure 5:
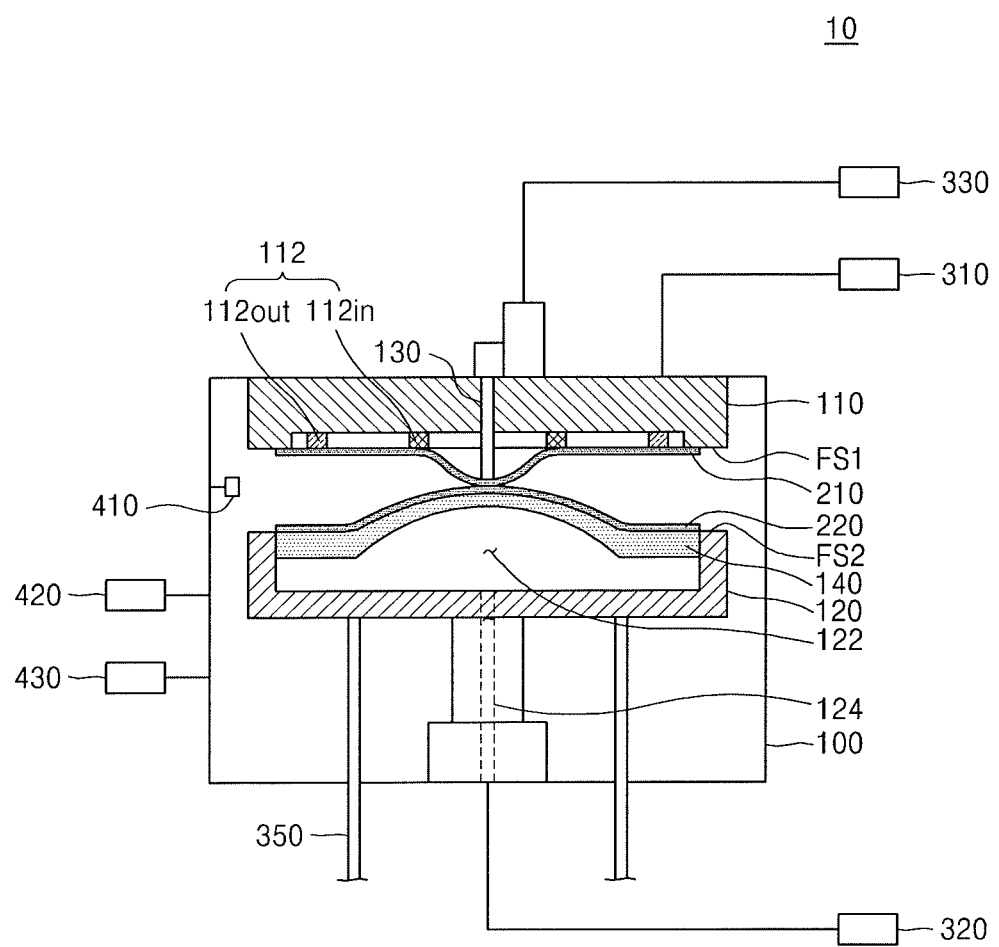
FIGS. 5 to 7 illustrate cross-sectional views of stages in a process of performing a wafer bonding process in a wafer bonding apparatus according to an embodiment.
Figure 6:
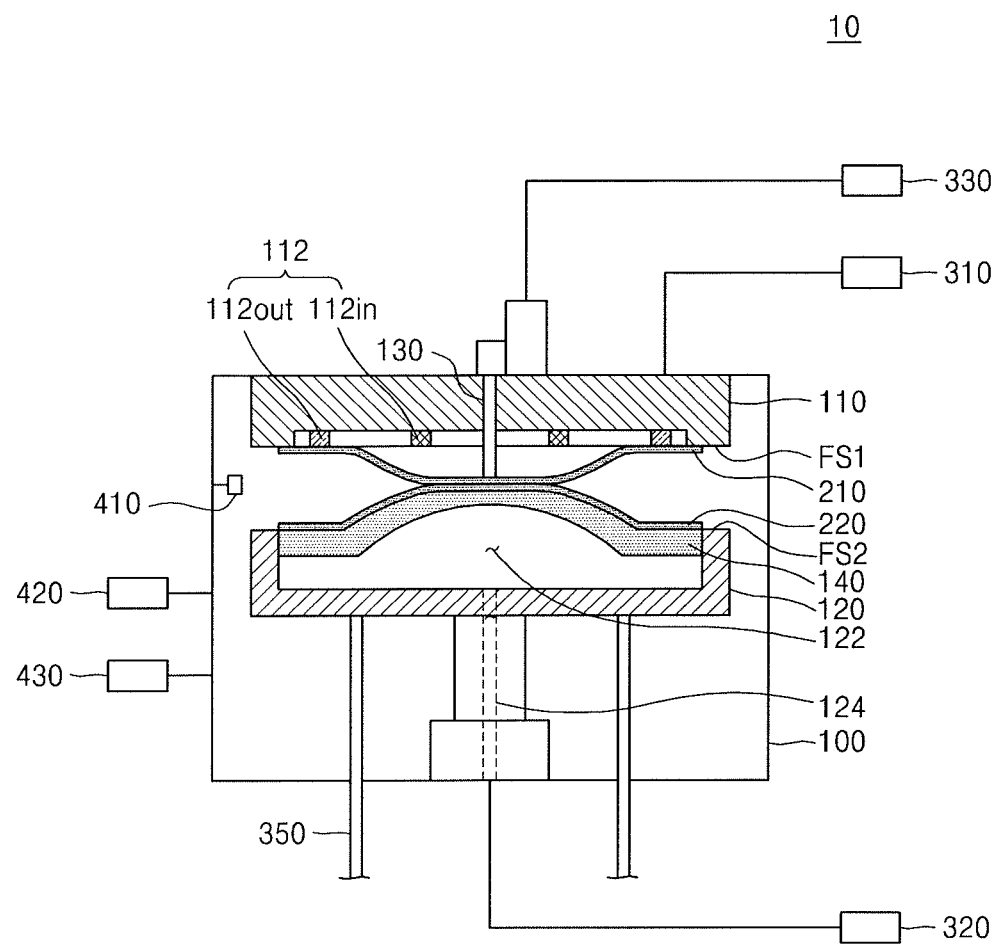
Figure 7:
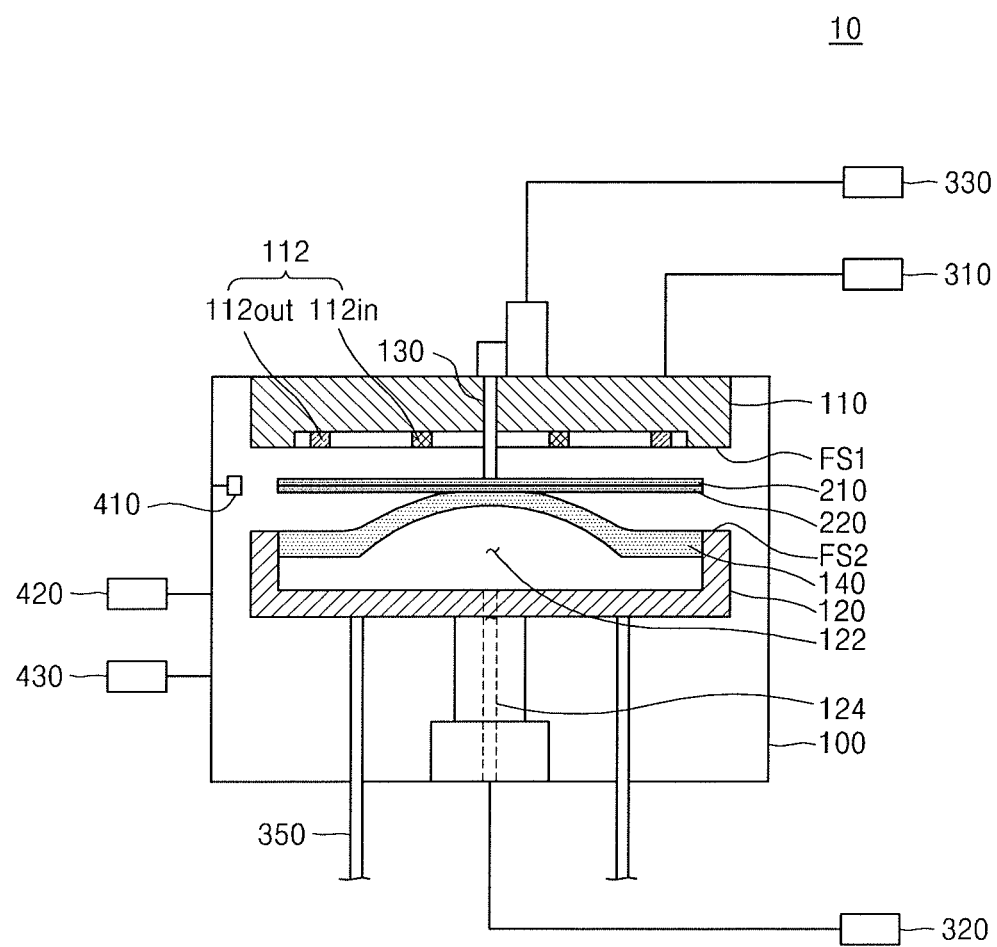

FIGS. 5 to 7 are cross-sectional views for describing a process of performing a wafer bonding process in the wafer bonding apparatus 10 according to an embodiment. As described above with reference to FIGS. 1 to 4, the first wafer 210 may be vacuum sucked and fixed by the first surface FS1 of the first bonding chuck 110. Also, the second wafer 220 may be arranged and fixed onto the second surface FS2 of the second bonding chuck 120. The fixing of the second wafer 220 to the second bonding chuck 120 may be performed on the membrane member 140.

Referring to FIG. 5, the center of the first wafer 210 is pressed downward by the bonding initiation member 130. Thus, the center portion of the first wafer 210 may be isolated from the first surface FS1 of the first bonding chuck 110.

An isolation distance of the first wafer 210 from the first surface FS1 of the first bonding chuck 110 may vary depending on a location of the internal vacuum recess 112in. For example, when the internal vacuum recess 112in is provided at a location relatively close to the center portion of the first wafer 210, the isolation distance of the first wafer 210 is relatively small. When the internal vacuum recess 112in is provided at a location relatively far from the center portion of the first wafer 210, the isolation distance of the first wafer 210 may be relatively large. Since the vacuum suction from the internal vacuum recess 112in interferes with the isolation of the first wafer 210 from the first surface FS1 of the first bonding chuck 110, pressurization of the bonding initiation member 130 is restricted to a range not damaging the first wafer 210, according to the location of the internal vacuum recess 112in. In addition, when the internal vacuum recess 112in is formed at a location that is relatively far from the center portion of the first wafer 210, the center portion of the first wafer 210 may contact the center portion of the second wafer 220 due to the pressurization of the bonding initiation member 130 and the substantial bonding operation may directly start.

The second bonding chuck 120 may move in an up-down direction, e.g., towards and away from the first bonding chuck 110, due to the chuck translation member 350. After the second wafer 220 is conformally deformed according to the shape of the membrane member 140 on the second surface FS2 of the second bonding chuck 120, the second bonding chuck 120 may be moved towards the first bonding chuck 110 and the substantial bonding operation may start.

As described above, the membrane member 140 may include the protrusion 140a protruding from the center portion thereof in a direction of the first surface FS1, and the planar portion 140b defining the protrusion 140a at the outer region surrounding the center portion. Also, the membrane member 140 may include a flexible material. Therefore, a contact area between the center portion of the first wafer 210 and the center portion of the second wafer 220 may be increased. Thus, deformation of the second wafer 220 may be controlled similarly to the deformation of the first wafer 210, e.g., may compensate for the deformation of the first wafer 210. Thus, the accuracy of the wafer-to-wafer bonding may be improved and the bonding may be sufficiently performed.

Referring to FIG. 6, after the pressurization of the bonding initiation member 130, the vacuum suction of the internal vacuum recess 112in is stopped. Accordingly, the bonding between the first wafer 210 and the second wafer 220 may propagate from the center portion to the outer region thereof.

Propagation of the bonding between the first wafer 210 and the second wafer 220 may be follow propagation of the isolation of the center portion of the first wafer 210 from the first surface FS1 of the first bonding chuck 110 to the outer region of the first wafer 210. For example, bonding between insulation layers is generally referred to as a direct bonding, and in the direct bonding, the first wafer 210 may be isolated from the first bonding chuck 110 by a spontaneous bonding force and the isolation may propagate from the center portion to the outer region. In some other embodiments, when an electrostatic chuck is used as the first bonding chuck 110, a pressurization operation of the bonding initiation member 130 is performed in a state where an electrostatic force is maintained, and then, the isolation of the first wafer 210 from the first bonding chuck 110 may be spontaneously performed.

In addition, when the bonding may not start according to the pressurization of the bonding initiation member 130 because the internal vacuum recess 112in is close to the center portion of the first wafer 210, the pressurization of the bonding initiation member 130 is further performed after stopping the vacuum suction of the internal vacuum recess 112in to start the bonding operation. Then, propagation of the bonding of the first wafer 210 and the second wafer 220 may proceed.

The center portion of the second wafer 220 contacting the protrusion 140a of the membrane member 140 may be bonded to the center portion of the first wafer 210. However, in this case, the outer region of the second wafer 220 contacting the planar portion 140b of the membrane member 140 may be still spaced apart from the outer region of the first wafer 210, and the bonding between the first and second wafers 210 and 220 may not be performed.

Referring to FIG. 7, when propagation of the bonding between the first wafer 210 and the second wafer 220 reaches the outer region of the first and second wafers 210 and 220, the external vacuum recess 112out of the first bonding chuck 110 stops the vacuum suction. Accordingly, the suction of the second bonding chuck 120 is also stopped. Due to the termination of the vacuum suction from the external vacuum recess 112out of the first bonding chuck 110 and from the second bonding chuck 120, the outer regions of the first wafer 210 and the second wafer 220 are bonded to each other, and bonding between the first wafer 210 and the second wafer 220 may be finished.

Finishing propagation of the bonding between the first wafer 210 and the second wafer 220 may indicate completion of the bonding process between the first wafer 210 and the second wafer 220. In addition, finishing propagation of the bonding between the first wafer 210 and the second wafer 220 may be coincide with the isolation, e.g., complete separation, of the first wafer 210 from the first surface FS1 of the first bonding chuck 110 and isolation, e.g., complete separation, of the second wafer 220 from the second surface FS2 of the second bonding chuck 120. In some embodiments, the termination of the vacuum suction from the external vacuum recess 112out may be performed before propagation of the bonding reaches the outer region of the first and second wafers 210 and 220.

In general, when the wafers are bonded in the wafer-to-wafer bonding method, the first wafer 210 may be relatively more stretched in a transverse direction as compared to the second wafer 220. The first wafer 210 is relatively more stretched than the second wafer 220 because the first wafer 210 is bonded to the second wafer 220 by using an OH— functional group in a state where the first wafer 210 is separated about 10 nm to 30 nm from the second wafer 220. Thus, the first wafer 210 is bonded to an upper surface of the second wafer 220 in a state where an upper surface of the first wafer 210 is finely stretched. When the above phenomenon occurs repeatedly, the first wafer 210 is attached in a state of being stretched as compared to the second wafer 220. Thus, misalignment of about 1 μm may occur around an edge of the first wafer 210.

To address this, in the wafer bonding apparatus 10 according to the embodiment, the membrane member 140 has a combined shape of the protrusion 140a and the planar portion 140b. Thus, the outer region of the first wafer 210 and the outer region of the second wafer 220 are bonded at once via the second wafer 220 that is arranged conformally along the shape of the membrane member 140. Therefore, the misalignment around the edge of the first wafer 210 may be improved. Also, the shape of the membrane member 140 may be controlled by the controller 430, and thus, may be applied individually according to a warpage characteristic of the wafer.

Figure 8:
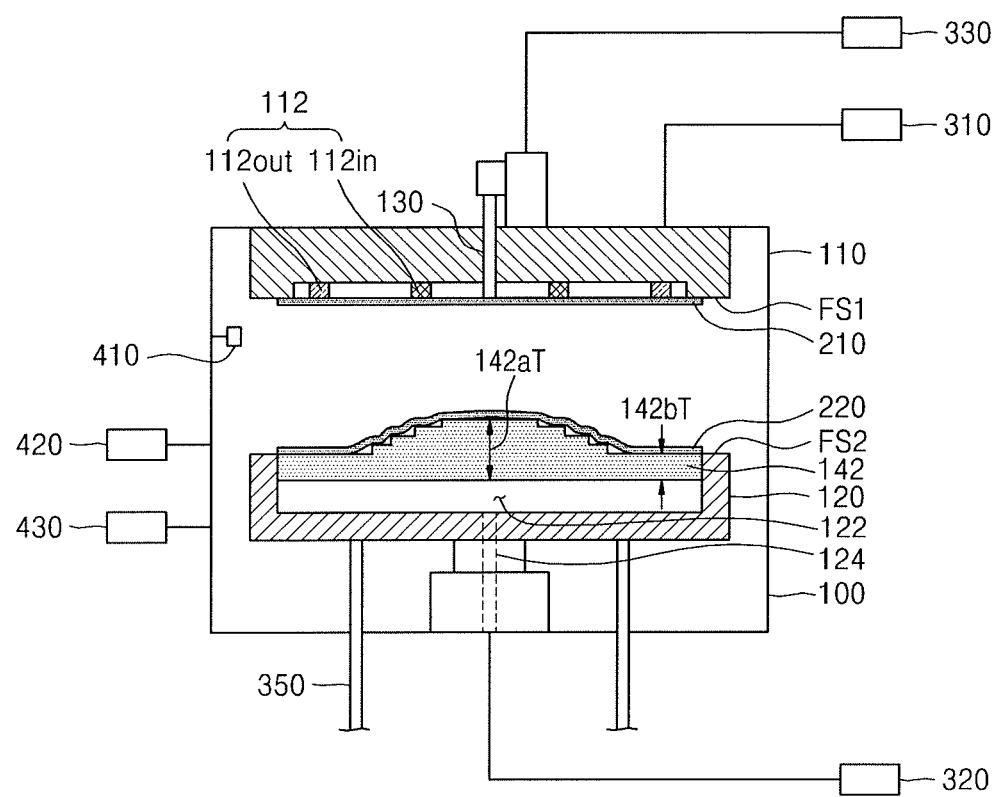
FIGS. 8 and 9 illustrate diagrams of a wafer bonding apparatus according to an embodiment.
Figure 9:
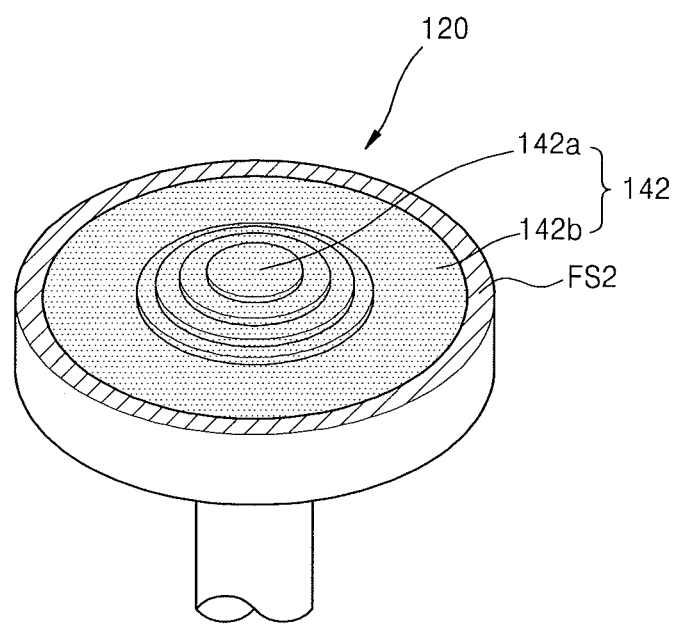
Figure 10:
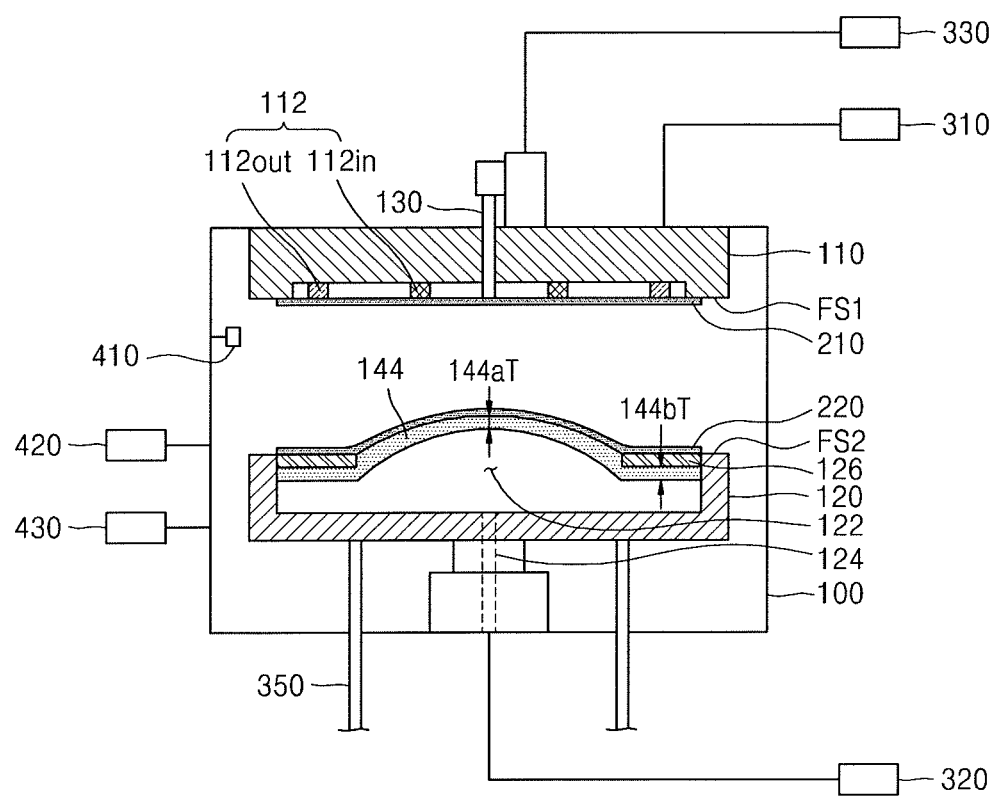
FIGS. 10 to 12C illustrate diagrams of a wafer bonding apparatus according to an embodiment.
Figure 11:
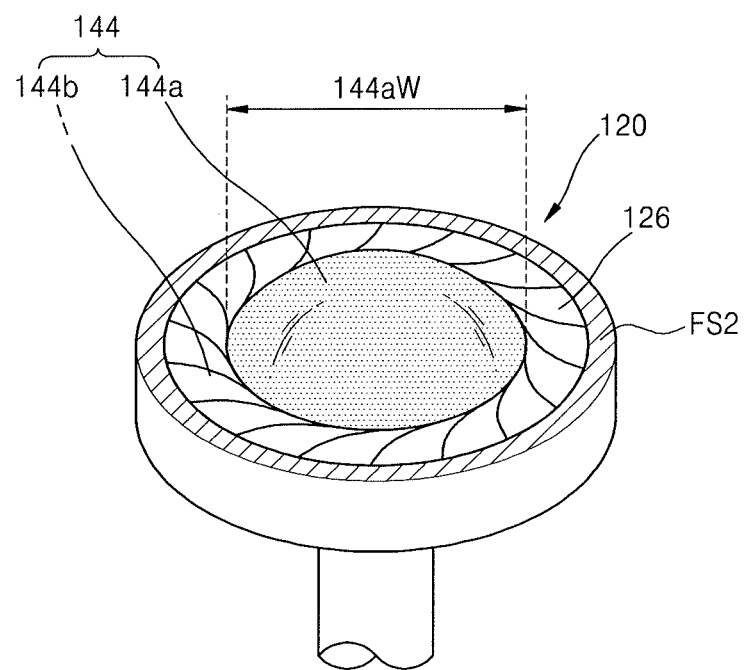

FIGS. 8 and 9 are diagrams of a wafer bonding apparatus 20 according to an embodiment. Components included in the wafer bonding apparatus 20 and functions of each component are similar to or identical with the above descriptions provided with reference to FIGS. 1 to 4, and thus, differences will be described below. FIG. 8 illustrates Referring to FIGS. 8 and 9, a membrane member 142 may be arranged as the second surface FS2 in the second bonding chuck 120 in order to adsorb the second wafer 220. FIG. 8 illustrates a sectional view of the wafer bonding apparatus 20 and FIG. 9 illustrates a perspective view of the membrane member 142.

The membrane member 142 may include a protrusion 142a at a center portion thereof, and a planar portion 142b at an outer region thereof. The second wafer 220 may be conformally arranged along the shape of the membrane member 142. As used herein, conformal does not require the second wafer 220 to follow the exact contours of the membrane member 142, but that the second wafer 220 preserves the orientation and angles of the membrane member 142.

In other words, the second wafer 220 is arranged and fixed onto the membrane member 142 including the protrusion 142a. The vacuum pump 310 may be connected to the second bonding chuck 120 similarly to the first bonding chuck 110 and may be used to fix the second wafer 220. The membrane member 142 may include a rigid material.

The membrane member 142 may have a thickness that varies depending on the center portion and the outer region thereof. In detail, the membrane member 142 may include the protrusion 142a protruding from the center portion thereof in a direction towards the first surface FS1, and the planar portion 142b defining the protrusion 142a at the outer region surrounding the center portion. A thickness 142aT of the protrusion 142a in the membrane member 142 may be greater than a thickness 142bT of the planar portion 142b. In particular, a maximum thickness 142aT of the protrusion 142a may decrease discontinuously, e.g., in a stepwise manner, until the thickness 142bT of the planar portion 142b. For example, the membrane member 142 may include a rigid material.

In some, embodiments, the protrusion 142a of the membrane member 142 may be provided as a truncated cone of a stair type, e.g., having equal step heights. A length of the protrusion 142a in the protruding direction may be determined according to the number of steps in the truncated cone of the stair type. Alternatively, the membrane member 142 may have another shape of a membrane member.

In particular, the membrane member 142 may be changed via replacement, e.g., may be swapped out as needed. As described above, since the shape of the membrane member 142 may be changed, the shape of the second wafer 220 that is conformally arranged along the shape of the membrane member 142 may be also changed. Therefore, the wafer bonding apparatus 20 according to the embodiment may provide a profile capable of improving a bonding accuracy between the first wafer 210 and the second wafer 220.

During a wafer-to-wafer bonding process, the shape of the first wafer 210 may be largely deformed at a center portion thereof as compared to the deformation on the outer region.

Accordingly, the shape of the second wafer 220 may be adjusted to be deformed to compensate for this deformation. Thus, the bonding accuracy of the wafers may be improved and deformation in processes after finishing the wafer bonding may be reduced.

FIGS. 10 to 12C are diagrams of a wafer bonding apparatus 30 according to an embodiment. Components included in the wafer bonding apparatus 30 and functions of each component are similar to or identical with the above descriptions provided with reference to FIGS. 1 to 4, and thus, differences will be described below.

Referring to FIGS. 10 to 12C, an aperture stop 126 may be arranged on a membrane member 144, while forming the second surface FS2 for sucking the second wafer 220 from the second bonding chuck 120.

The aperture stop 126 may serve as the second surface FS2 to adsorb the second wafer 220 on the second bonding chuck 120. The membrane member 144 may include a protrusion 144a protruding from an opening portion of the aperture stop 126 in a direction towards the first surface FS1, and a planar portion 144b in a closed portion of and under the aperture stop 126, such that the outer region of the second wafer is in contact with the aperture stop 126 instead of the planar portion 144b.

A process of deforming a shape of the membrane member 144 will be briefly described below. First, the membrane member 144 may start by adsorbing the second wafer 220 from the second bonding chuck 120, e.g., a flat shape. The second wafer 220 is arranged and fixed onto the flat membrane member 144 that is flat.

Next, the pneumatic pressure provided from the air pump 320 may be applied to the void portion 122 that is an empty space located under a lower surface of the membrane member 144. Accordingly, the membrane member 144 has the protrusion 144a from the opening portion of the aperture stop 126, and the planar portion 144b at the closed portion of the aperture stop 126. A width 144aW (FIG. 11) of the protrusion 144a may be substantially the same as a width 126aW, 126bW, or 126cW (FIGS. 12A to 12C) of the opening portion in the aperture stop 126 according to an aperture ratio of the aperture stop 126. The second wafer 220 may be arranged conformally along the shape of the membrane member 144 and a shape of the aperture stop 126.

A thickness of the membrane member 144 may be substantially constant throughout a whole surface thereof. That is, a thickness 144aT of the protrusion 144a in the membrane member 144 may be substantially equal to a thickness 144bT of the planar portion 144b. The membrane member 144 may include a flexible material. Due to the pneumatic pressure provided from the air pump 320, the protrusion 144a of the membrane member 144 may be formed as a hemispherical surface having a predetermined radius in a protruding direction.

The predetermined radius of the hemispherical surface may vary according to a variation in the pneumatic pressure provided from the air pump 320 and/or the aperture ratio of the aperture stop 126. For example, the air tube 124 connected to the air pump 320 is provided in the void portion 122 of the second bonding chuck 120, and a pressure in the void portion 122 may be controlled by the controller 430. The shape of the membrane member 144 may be deformed according to the pressure of the void portion 122. When the pressure of the void portion 122 is high, the radius of the hemispherical surface may increase. On the other hand, when the pressure of the void portion 122 is low, the radius of the hemispherical surface may decrease.

Figure 12A:
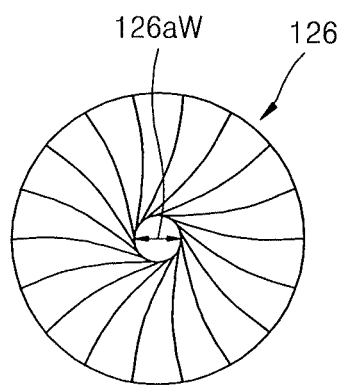
Figure 12B:
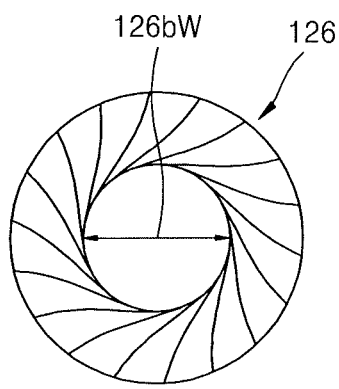
Figure 12C:
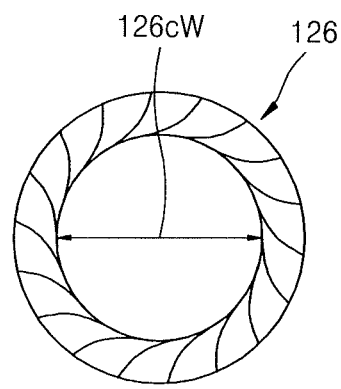

For example, as shown in FIGS. 12A to 12C, the aperture stop 126 may increase or decrease the aperture ratio of the aperture stop 126 by a constant rate according to a control of the controller 430, in order to adjust the protrusion 144*a* of the membrane member 144. The shape of the membrane member 144 may be deformed according to the aperture ratio of the aperture stop 126. When the aperture ratio of the aperture stop 126 increases, i.e., when the width 126*c*W of the opening portion of the aperture stop 126 increases, the width 144*a*W of the protrusion 144*a* may also increase. On the contrary, when the aperture ratio of the aperture stop 126 is reduced, that is, the width 126*a*W of the opening portion of the aperture stop 126 decreases, the width 144*a*W of the protrusion 144*a* may also decrease. In addition, the aperture stop 126 may increase or decrease the aperture ratio by a constant rate, the width 144*a*W of the protrusion 144*a* of the membrane member 144, which is exposed by the aperture stop 126, may be uniformly adjusted.

A motor driving the aperture stop 126 may be, e.g., a stepping motor capable of adjusting the aperture ratio step-by-step. The motor may rotate a gear from an outer portion of the aperture stop 126. When the aperture stop 126 is rotated in a clockwise direction or a counter-clockwise direction by the motor, the aperture stop 126 may be gradually opened or closed. Principles of driving the aperture stop 126 are well known in the art, and thus, detailed descriptions thereof are omitted.

Thus, the shape of the protrusion 144*a* in the membrane member 144 may be changed according to the variation in the pneumatic pressure provided from the air pump 320 and/or the aperture ratio of the aperture stop 126. As described above, since the shape of the membrane member 144 may be changed, the shape of the second wafer 220 that is conformally arranged along the shape of the membrane member 144 may be also changed. Therefore, the wafer bonding apparatus 30 according to the embodiment may provide a profile capable of improving a bonding accuracy between the first wafer 210 and the second wafer 220.

FIGS. 13A to 13C are plan views showing relative deformations on a first wafer and a second wafer in a wafer bonding apparatus when deformation compensation is not employed. Referring to FIGS. 13A to 13C, a deformation force of the first wafer 210 may be represented by arrows 214, and the deformation after finishing the bonding between the first wafer 210 and the second wafer 220 may be exaggerated as shown in FIGS. 13A to 13C for convenience of description.

As shown in FIG. 13A, lengths of the arrows 214 may correspond to a magnitude of the deformation force of the first wafer 210. As described above, the first wafer 210 may include silicon, and since the silicon has a crystallographic orientation, the first wafer 210 may also have the crystallographic orientation according to the silicon. The first wafer 210 may include the alignment feature 212 for alignment. Also, the second wafer 220 may also have an alignment feature 222, e.g., that matches the alignment feature of the first wafer 210, such as a notch, for alignment, and the alignment features 212 and 222 may be aligned in the same direction as each other.

The direction of the alignment feature 212 in the first wafer 210 may correspond to a crystallographic orientation [110]. A crystallographic orientation [100] or [010] may be arranged at a 45° angle from the crystallographic orientation [110]. The deformation force in the crystallographic orientation [110] may be less than that in the crystallographic orientations [100] and [010]. Therefore, the crystallographic orientation may be less deformed than the crystallographic orientations [100] and [010].

When the bonding initiation member 130 pushes the first wafer 210 from the first bonding chuck 110, as shown in FIG. 13B, the first wafer 210 may be instantly deformed similarly to a square shape. Here, the second wafer 220 may maintain a circular shape. When the second wafer 220 is completely bonded to the first wafer 210, the first wafer 210 may be isolated from the first bonding chuck 110.

After finishing the bonding between the first wafer 210 and the second wafer 220, when the non-active surface of the second wafer 220 is partially polished, the first wafer 210 may be recovered to the circular shape. This may be because the second wafer 220 that is polished may have a thickness that is less than that of the first wafer 210 that is not polished. The second wafer 220 that is polished may be deformed similarly to a square shape. Therefore, as shown in FIG. 13C, the square shape of the polished second wafer 220 may be arranged in a diagonal direction with respect to the square shape of the first wafer 210 that is not polished.

As described above, during and after bonding of the wafers in the wafer bonding apparatus according to the related art, different deformations of the first wafer 210 and the second wafer 220 relative to each other may occur. Therefore, there is a need for a wafer bonding apparatus capable of accurately performing the bonding between the first wafer 210 and the second wafer 220 by predicting and reflecting relative deformations of the first wafer 210 and the second wafer 220.

FIG. 14 is a graph showing relative deformations in the first wafer 210 and the second wafer 220 in a wafer bonding apparatus according to an embodiment. Referring to FIG. 14, a stretching degree of each of the first wafer 210 and the second wafer 220 in a direction away from the center portion of the first and second wafers 210 and 220 (transverse deformation) was measured.

As described above, when the wafers are bonded according to the wafer-to-wafer bonding method, the first wafer 210 may be relatively more stretched compared to the second wafer 220 in the transverse direction. In other words, the transverse deformation of the first wafer 210 may be greater than that of the second wafer 220.

By recognizing that the transverse deformation of the first wafer 210 is relatively large compared with the second wafer 220 because the first wafer 210 and the second wafer 220 are bonded via OH— connection in a state where the first and second wafers 210 and 220 are separated by about 10 nm to about 30 nm from each other, and the active surface of the first wafer 210 is bonded to the active surface of the second wafer 220 in a state of being finely stretched. When the above phenomenon repeatedly occurs and the bonding is performed, the first wafer 210 may be attached to the second wafer 220 in a stretched state, the transverse deformation of about 1 μm may be generated around the edge of the first wafer 210, and accordingly, the first wafer 210 and the second wafer 220 may be misaligned with each other.

To address this, in the wafer bonding apparatus 10, 20, or 30 according to embodiments, the membrane member 140, 142, or 144 to which the second wafer 220 is fixed has a combined shape of the protrusion 140*a*, 142*a*, or 144*a* and the planar portion 140*b*, 142*b*, or 144*b* to address the misalignment between the first wafer 210 and the second wafer 220.

In the drawings, the first wafer 210 and the second wafer 220 may each have a diameter of about 12 inches (300 mm), and the transverse deformation of each of the first wafer 210 and the second wafer 220 from the center portion to the outer region thereof was measured and shown in the graph of FIG. 14.

As a measurement result, the transverse deformation of the first wafer 210 slowly increased from the center portion thereof to about 80 mm and did not increase from about 80 mm. Also, the transverse deformation of the second wafer 220 linearly increased from the center portion thereof to about 80 mm and did not increase from about 80 mm. That is, the transverse deformation of the center portion in each of the first wafer 210 and the second wafer 220 is relatively large, and the transverse deformation of the outer region in each of the first wafer 210 and the second wafer 220 is relatively small.

When the measured transverse deformation of the first wafer 210 and the second wafer 220 described above is analyzed, the transverse deformations of the first wafer 210 and the second wafer 220 are identical with each other at a significant level (error range about 2.5 ppm). Thus, improvement in the bonding accuracy of the wafer bonding apparatus 10, 20, or 30 according to embodiments may be expected.

Figure 15:
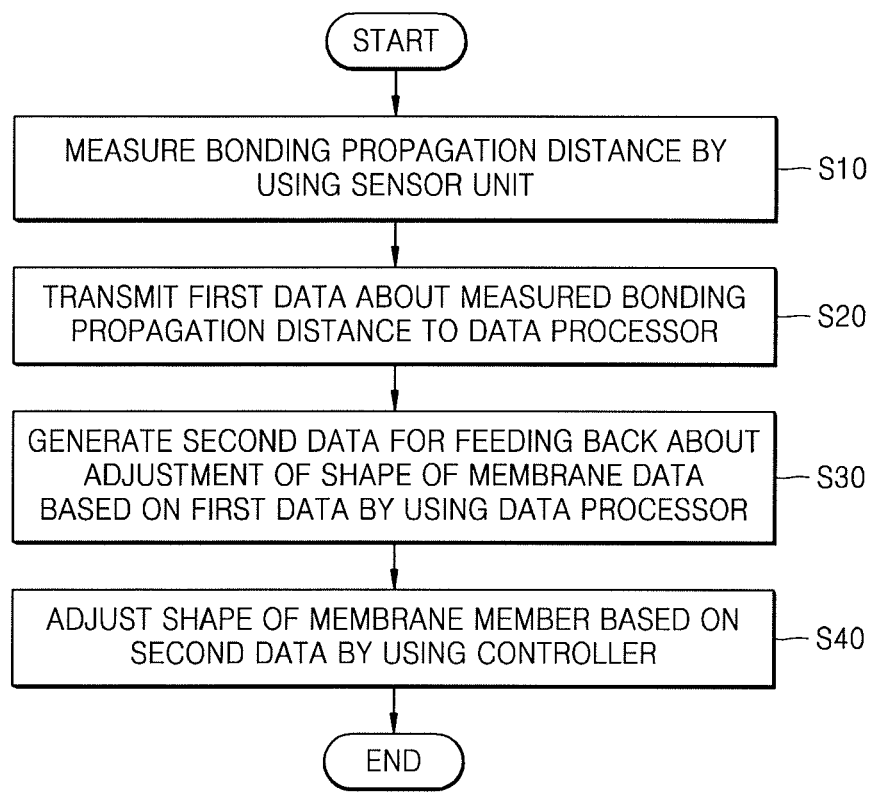
FIG. 15 illustrates a flowchart of a method of wafer bonding according to an embodiment.

FIG. 15 is a flowchart illustrating processes performed in a wafer bonding system 1000 according to an embodiment. The wafer bonding processes performed by the wafer bonding apparatus 10 are similar to or the same as the above descriptions provided with reference to FIGS. 5 to 7, and thus, processes of data treatment in the wafer bonding system 1000 will be described below.

Referring to FIGS. 1 and 15, the wafer bonding system 1000 according to the embodiment includes measuring a bonding propagation distance using the sensor unit 410 (S10), transmitting first data about the measured bonding propagation distance to the data processor 420 (S20), generating second data for feeding back into adjustment of the shape of the membrane member 140 based on the first data by using the data processor 420 (S30), and adjusting the shape of the membrane member 140 based on the second data by using the controller 430 (S40).

As described above, the sensor unit 410 may be arranged on a side surface of the chamber 100 to be spaced apart from the first bonding chuck 110. Here, the sensor unit 410 may denote a three-dimensional (3D) sensor that three-dimensionally senses a physical variation in the entirety of the first wafer 210.

Measuring the bonding propagation distance by using the sensor unit 410 (S10) may include measuring the bonding propagation distance that varies depending on a kind of the first wafer 210, e.g., the wafer including a logic chip, an SOC, an ASIC, an image sensor chip, etc. To do this, the sensor unit 410 may sense portions of the first wafer 210, which are isolated from the first surface FS1 of the first bonding chuck 110.

Transmitting the first data about the measured bonding propagation distance of the first wafer 210 to the data processor 420 (S20) may include transmitting the first data to the data processor 420 as an electric signal to store the first data in the data processor 420 and analyze the first data in the data processor 420.

Generating of the second data for feeding back into the adjustment of the shape of the membrane member 140 based on the first data in the data processor 420 (S30) may include generating the second data for adjusting the deformation of the second wafer 220 based on data for analyzing the pneumatic pressure provided from the air pump 320, data about the thickness of the membrane member 140, and/or data about the aperture ratio of the aperture stop 126.

Adjusting of the shape of the membrane member 140 in the controller 430 based on the second data (S40) may control the protrusion 140a of the membrane member 140 via the controller 430. As described above, the differential pressure caused by the pneumatic pressure provided from the air pump 320 is applied to the lower surface of the membrane member 140. Thus, the membrane member 140 may include the protrusion 140a at the center thereof and the planar portion 140b at the outer region thereof. Also, the second wafer 220 may be conformally arranged along the shape of the membrane member 140.

Therefore, when the controller 430 adjusts the shape of the membrane member 140 based on the second data, the deformation of the second wafer 220 may be consequently controlled. Accordingly, the wafer bonding system 1000 according to the embodiment may improve the bonding accuracy between the first wafer 210 and the second wafer 220.

One or more embodiments provide a wafer bonding apparatus, system, and method capable of improving a wafer bonding accuracy in a wafer bonding process, and precisely measuring and controlling a wafer bonding state.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wafer bonding apparatus, comprising:
a first bonding chuck to fix a first wafer arranged on a first surface thereof;
a second bonding chuck to fix a second wafer on a second surface thereof, the second surface facing the first surface;
a bonding initiation member at a center of the first bonding chuck to push the first wafer towards the second surface; and
a membrane member having a protrusion protruding from a center portion of the second surface towards the first surface and a planar portion defining the protrusion in an outer region surrounding the center portion of the second surface.

2. The wafer bonding apparatus as claimed in claim 1, wherein a thickness of the protrusion of the membrane member is less than a thickness of the planar portion, and the membrane member includes a flexible material.

3. The wafer bonding apparatus as claimed in claim 2, further comprising an air pump to provide a pneumatic pressure to a lower surface of the membrane member that faces an upper surface where the membrane member contacts the second wafer, wherein the protrusion of the membrane member is formed by the pneumatic pressure as a hemispherical surface having a predetermined radius in a protruding direction.

4. The wafer bonding apparatus as claimed in claim 3, wherein the predetermined radius of the hemispherical surface varies depending on a variation in the pneumatic pressure.

5. The wafer bonding apparatus as claimed in claim 1, wherein a thickness of the protrusion of the membrane member is greater than a thickness of the planar portion, and the membrane member includes a rigid material.

6. The wafer bonding apparatus as claimed in claim 5, wherein the protrusion of the membrane member is provided as a truncated cone of a stair type.

7. The wafer bonding apparatus as claimed in claim 1, wherein the membrane member is replaceable with a membrane member of a different shape.

8. The wafer bonding apparatus as claimed in claim 1, wherein the bonding initiation member pushes a center of the first wafer in a direction towards the second wafer to obtain a bonding propagation distance in the first wafer, and the membrane member forces the second wafer to protrude from a center portion thereof towards the first wafer and to have a flat outer region.

9. The wafer bonding apparatus as claimed in claim 8, further comprising a sensor spaced apart from the first bonding chuck and the second bonding chuck to measure the bonding propagation distance.

10. The wafer bonding apparatus as claimed in claim 9, wherein the sensor includes a plurality of sensors, and at least three sensors are arranged to be spaced apart from each other with an azimuth of 45° from a location corresponding to an alignment feature in the first wafer.

11. A wafer bonding apparatus, comprising:
a first bonding chuck to fix a first wafer arranged on a first surface thereof;
a second bonding chuck to fix a second wafer on a second surface thereof, the second surface facing the first surface;
a bonding initiation member at a center of the first bonding chuck to push the first wafer towards the second surface;
an aperture stop serving as the second surface of the second bonding chuck; and
a membrane member having a protrusion protruding from a center portion of the second surface towards the first surface and a planar portion in a closed portion of the aperture stop, wherein the protrusion protrudes from an opening portion of the aperture stop in a direction towards the first surface.

12. The wafer bonding apparatus as claimed in claim 11, wherein a thickness of the membrane member is substantially constant throughout a whole surface thereof, and the membrane member includes a flexible material.

13. The wafer bonding apparatus as claimed in claim 12, further comprising an air pump to provide a pneumatic pressure to a lower surface of the membrane member that faces an upper surface where the membrane member contacts the second wafer, and the protrusion of the membrane member is formed by the pneumatic pressure as a hemispherical surface having a predetermined radius in a protruding direction.

14. The wafer bonding apparatus as claimed in claim 13, wherein the predetermined radius of the hemispherical surface varies according to a variation in the pneumatic pressure and/or an aperture ratio of the aperture stop.

15. The wafer bonding apparatus as claimed in claim 11, wherein:
the bonding initiation member pushes a center of the first wafer in a direction towards the second wafer to obtain a bonding propagation distance in the first wafer, and
the membrane member and the aperture stop force the second wafer to have a center portion protruding towards the first wafer and to have a flat outer region.

16. A wafer bonding system, comprising:
a first bonding chuck to fix a first wafer arranged on a first surface thereof;
a second bonding chuck to fix a second wafer on a second surface thereof facing the first surface;
a bonding initiation member at a center of the first bonding chuck to push the first wafer in a direction towards the second surface;
a membrane member including a protrusion protruding from a center portion of the second surface towards the first surface, and a planar portion defining the protrusion on an outer region surrounding the center portion of the second surface;
a sensor spaced apart from the first bonding chuck and the second bonding chuck to measure a bonding propagation distance of the first wafer; and
a controller to control a shape of the membrane member according to the bonding propagation distance.

17. The wafer bonding system as claimed in claim 16, further comprising an air pump to provide a pneumatic pressure to a lower surface of the membrane member that faces an upper surface where the membrane member contacts the second wafer, via the second bonding chuck, and the protrusion of the membrane member is formed by the pneumatic pressure as a hemispherical surface having a predetermined radius in a protruding direction.

18. The wafer bonding system as claimed in claim 16, wherein the second surface of the second bonding chuck includes an aperture stop, and the membrane member includes the protrusion protruding from an opening portion of the aperture stop in a direction towards the first surface and the planar portion in a closed portion of the aperture stop.

19. The wafer bonding system as claimed in claim 16, further comprising a data processor to receive first data about the bonding propagation distance measured by the sensor according to a kind of the first wafer.

20. The wafer bonding system as claimed in claim 19, wherein the data processor generates second data for feeding back about adjustment of the shape of the membrane member, based on the first data.

\* \* \* \* \*